United States Patent [19]

Verbanets et al.

[11] Patent Number: 4,876,502

[45] Date of Patent: Oct. 24, 1989

[54] WIDE DYNAMIC RANGE CURRENT MEASURING APPARATUS

[75] Inventors: William R. Verbanets, Plum Borough; Robert T. Elms, Monroeville, both of Pa.

[73] Assignee: Westinghouse Electric Corp., Pittsburgh, Pa.

[21] Appl. No.: 192,059

[22] Filed: May 9, 1988

[51] Int. Cl.$^4$ .................. G01R 19/25; G01R 19/257
[52] U.S. Cl. .................. 324/115; 324/99 D; 324/130; 324/116; 341/139
[58] Field of Search .............. 330/254, 278, ; 307/264; 324/99 D, 99 R, 103 P, 103 R, 115, 116, 127, 142, 130; 341/139, 158, 161

[56] References Cited

U.S. PATENT DOCUMENTS

| | | | |
|---|---|---|---|
| 3,813,609 | 5/1974 | Wilkes et al. | 341/139 |
| 4,016,557 | 4/1977 | Zitelli et al. | 341/139 |
| 4,191,995 | 3/1980 | Farrow | 307/264 |
| 4,214,233 | 7/1980 | Shaw et al. | 341/158 |
| 4,329,641 | 5/1982 | Ikeda et al. | 324/115 |
| 4,345,331 | 8/1982 | Fielden | 324/142 |
| 4,364,027 | 12/1982 | Murooka | 324/130 |
| 4,490,713 | 12/1984 | Mrozowski et al. | 340/347 AD |
| 4,517,550 | 5/1985 | Nakamura et al. | 324/115 |
| 4,531,089 | 7/1985 | Ishizuka et al. | 324/99 D |
| 4,584,558 | 4/1986 | Maschek et al. | 341/139 |
| 4,626,831 | 12/1986 | Engel . | |
| 4,663,586 | 5/1987 | Swerlein et al. | 324/115 |

Primary Examiner—Reinhard J. Eisenzopf
Assistant Examiner—W. Burns
Attorney, Agent, or Firm—B. R. Studebaker

[57] ABSTRACT

Apparatus for measuring current over a wide range generates an eight bit accurate, 16-bit dynamic range digital signal from a current transformer secondary. Two signals proportional to the rectified secondary current, one generated by a large burden resistor and the other by an amplifier with programmable gain and an overrange indication, are applied through a multiplexer to an eight bit analog to digital converter which has three selectable reference voltages. A microprocessor selects the input signal, converter reference voltage, and one of four levels of amplifier gain which provide the greatest resolution for the magnitude of the current being measured, and provides an appropriate scale factor, from $2^0$ to $2^8$, for the eight bit accurate digital signal generated by the analog to digital converter.

9 Claims, 2 Drawing Sheets

WIDE DYNAMIC RANGE CURRENT MEASURING APPARATUS

BACKGROUND OF THE INVENTION

1. Field of the Invention

This invention relates to apparatus for measuring alternating current accurately and more particularly to such apparatus which accurately measures currents over a wide range.

2. Background Information

A current transformer provides a secondary winding current proportional to the current flowing through its primary winding. One application of current transformers is in the accurate reproduction of ac current conditions in a power system for current sensing and operation of protective relays.

The inverse-time and instantaneous overcurrent relay is one type of relay that uses current transformers. It must detect an input current at a certain level (called "pickup") and either perform an inverse-time protection function based upon current above pickup or provide an instantaneous protection function for currents above pickup.

The pickup may vary widely and the required working range could be large. For example, in one type of overcurrent relay, the pickup range is 0.5 A to 12 A and the current range is 40× pickup with a ceiling of 240 A. This means that the device must be able to handle accurately a current range of 0.5 A to 240 A or 480:1.

In the prior art, accommodating this wide range of input currents is accomplished by either changing the winding ratio of the current transformer or by changing the burden resistor in the secondary as a function of pickup level. In either case, the net effect is to provide a fixed voltage across the secondary for a given pickup level.

A change in burden resistors is achieved by a number of precision resistors in series with switches or relays and a change in the winding ratio is achieved by tap blocks that manually change the number of primary windings.

There remains a need for apparatus which can accurately measure a wide range of input currents without the need for switching burden resistors or modifying the current transformer winding ratio.

SUMMARY OF THE INVENTION

This and other needs are satisfied by wide dynamic range current measuring apparatus. which includes a current transformer, an analog to digital converter, a programmable gain amplifier with means generating air overrange signal when the amplifier output exceeds a preset limit, means applying a signal proportional to the secondary current to the amplifier, means applying the output of the amplifier to the analog to digital converter, and control means which selects the highest programmable gain of the amplifier without producing an overrange signal and which provides an output signal including the digital signal generated by the analog to digital converter and a scale factor which is a function of the selected gain of the amplifier.

Preferably, the analog to digital converter has a plurality of discrete selectable reference voltages providing a plurality of resolutions for the digital signal generated thereby, and the control means includes means to select the selectable reference voltage which provides the greatest resolution for the digital signal and provides a scale factor which is a function of both the gain of the amplifier and the selected reference voltage of the analog to digital converter.

As another aspect of the invention, the secondary current of the current transformer is converted to a voltage signal by a burden resistor and applied to an analog to digital converter with a selectable reference voltage which provides selectable resolution of the digital signal. Means responsive to the magnitude of the secondary current select the reference voltage for the analog to digital converter which provides the greatest resolution of the digital signal. Additional means provide an output signal which includes the digital signal generated by the analog to digital converter and a scale factor generated as a function of the reference voltage selected.

In the preferred embodiment of the invention, a first voltage signal generated across a large burden resistor is converted to the digital signal for small values of current through the current transformer, and the output of an amplifier is used for higher current. To this end, the burden resistor has an ohmic value which produces a full range voltage signal for the analog to digital converter at a preselected low value of secondary current. Current limiting means limit the current through the burden resistor to this preselected low value. Other means apply a reference current proportional to, but having a magnitude less than, the secondary current to the amplifier which produces a second voltage signal. A microprocessor is programmed to apply the first voltage signal generated across the burden resistor to an analog to digital converter when the secondary current is below the preselected low value, to apply the second voltage signal from the amplifier to the analog to digital converter when the secondary current is above the preselected low value, and to generate an output signal which includes the digital signal generated by the analog to digital converter and a scale factor dependent upon which of the first and second voltages is converted to the digital signal. More particularly in this form of the invention, the analog to digital converter is provided with selectable reference voltages, the amplifier is provided with selectable gain, and the microprocessor is programmed to select the highest gain for the amplifier which does not produce an overrange signal and the reference voltage which produces the best resolution for the digital signal and to generate a scale factor for the digital signal which is a function of both the selected reference voltage and the programmable gain.

In exemplary apparatus, the analog to digital converter generates an eight bit digital signal. Three selectable reference voltages for the analog to digital converter provide two more bits. The amplifier has gains of 1, ½, ¼ and 1/16 to add four more bits of resolution. Finally, the value of the burden resistor is selected to provide a full range voltage signal for the analog to digital converter at a preselected low secondary current which produces only a ¼ full range signal from the amplifier with maximum gain selected to add two more bits of resolution. Thus, the preferred apparatus produces a digital signal with 16 bits of resolution and eight bit accuracy.

BRIEF DESCRIPTION OF THE DRAWINGS

A full understanding of the invention can be gained from the following description of the preferred embodi

DESCRIPTION OF THE PREFERRED EMBODIMENTS

Figure 1:
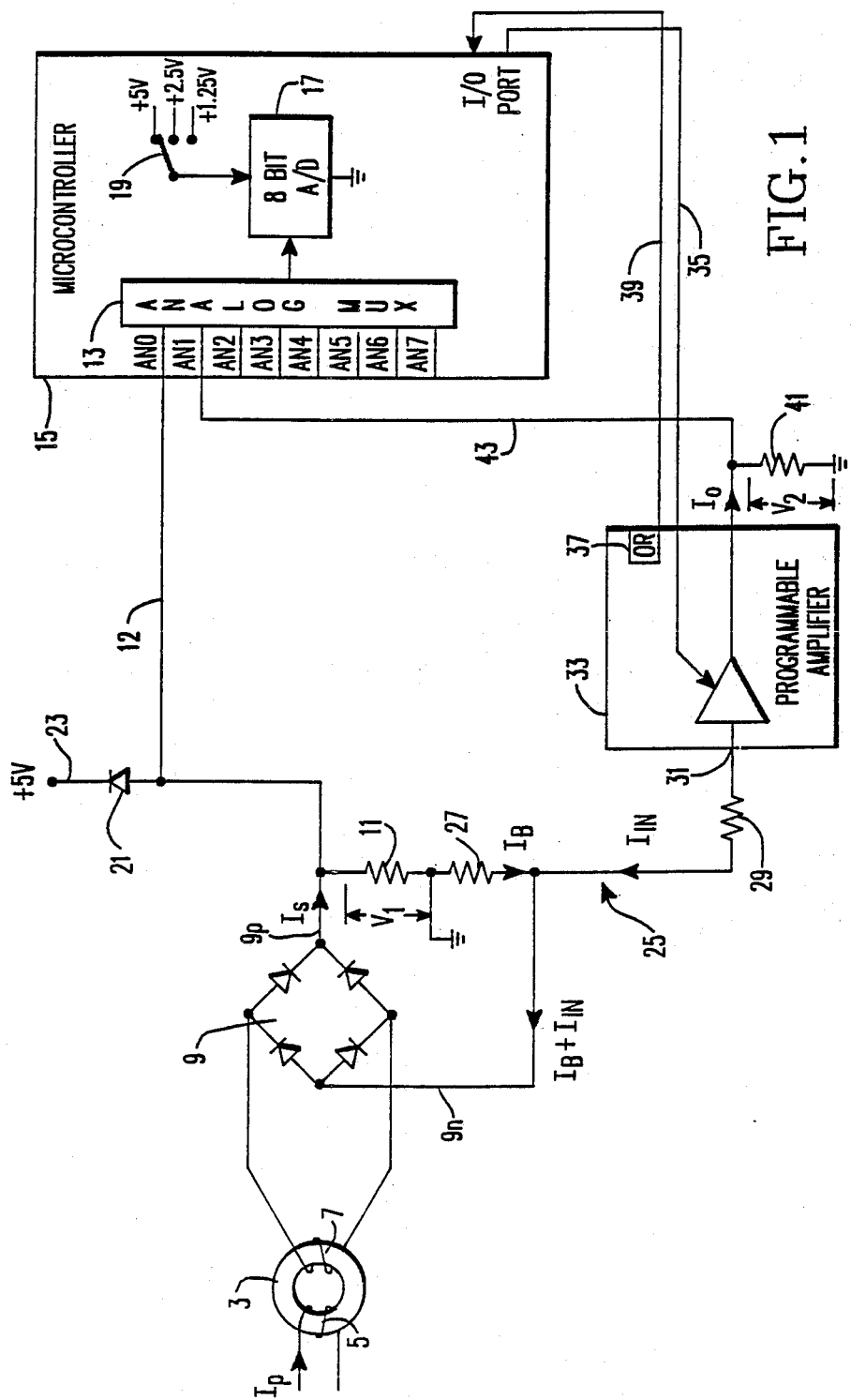
- FIG. 1 is schematic diagram of current measuring apparatus in accordance with the teachings of the invention.

As illustrated in FIG. 1, the current measuring apparatus of the invention includes a conventional current transformer 3 having a primary winding 5 through which the current $I_p$ to be measured flows, and secondary winding 7. The ratio of turns on the primary winding to those on the secondary winding 7 is 3000:1. A full wave rectifier bridge 9 converts the ac current in the secondary winding 7 to a dc current, $I_s$, which is always positive with respect to ground.

A first burden resistor 11 connected between the positive output terminal 9p of the full wave rectifier 9 and ground converts the dc current $I_s$ to a first dc voltage $V_1$. This voltage $V_1$ is applied by lead 12 to the AN0 input of an analog multiplexer 13 which forms a part of a microcontroller 15. The analog multiplexer 13 applies a selected analog voltage to an eight bit analog to digital convertor 17 which also forms part of the microcontroller 15. A suitable microcontroller 15 is the SAB 80535 microcontroller manufactured by Siemens Components, Inc. This microcontroller 15 provides a programmable reference voltage source 19 for the analog to digital converter 17. Selectable reference voltages of five volts, 2.5 volts, and 1.25 volts provide two extra bits of resolution to the digital output generated by the analog to digital converter 17. Thus, analog to digital converter 17 converts an applied analog signal to a digital signal with ten bits of resolution and eight bit accuracy.

The ohmic value of a burden resistor 11 is selected to be large enough to provide good accuracy for currents at the low end of the range of currents to be measured. The higher the ohmic value of burden resistor 11, the larger will be the voltage $V_1$, and hence the better the accuracy of the measurement. However, since the transformer 3 is a current source, currents at the high end of the range of current to be measured would result in the dissipation of a large amount of power in the resistor 11. In order to limit the power rating required for the resistor 11, the current through this resistor is limited by a diode 21 reversed biased by a dc voltage source 23. Thus all of the current $I_s$ flows through the burden resistor 11 until the voltage $V_1$ reaches the voltage of the source 23 plus the forward drop across the diode 21. For example, with a 5 volt voltage source 23 and a 2.82K burden resistor 11, all of the current will flow through the first burden resistor 11 up to current $I_s$ corresponding to a current of 3.75 A rms in the primary winding of the current transformer 3. For primary currents of greater magnitude, the excess current $I_s$ is shunted by the diode 21. Thus the AN0 input to the multiplexer 13 is clamped at approximately 5 volts.

In order to measure currents of greater magnitude, a circuit 25 is provided for generating a current which is proportional to, but smaller than, the current $I_s$. This circuit includes a second burden resistor 27 in parallel with a reference resistor 29. This parallel circuit 25 is connected between ground and the negative dc terminal 9n of the full wave rectifier bridge 9. The reference resistor 29 is connected to virtual ground at the input 31 of a programmable amplifier 33. A current $I_B$ flows through the burden resistor 27 and current $I_{in}$ flows through the reference resistor 29. Since the current transformer 3 is a current source, $I_B + I_{in} = I_s$. The ohmic values of the resistors 27 and 29 are selected so that the current $I_{in}$ is at least an order of magnitude smaller than the current $I_B$. In the exemplary apparatus, these resistors are selected so that the current $I_{in}$ has a range of zero to 1600 microamps for the full range of currents, $I_p$, in the primary winding 5 of the current transformer 3. Suitable values are 301 ohms for the resistor 27 and 21K for the reference resistor 29.

The gain of the programmable amplifier 33 is controlled by a signal provided by the microcontroller 15 over lead 35. Four discrete gains of 1, $\frac{1}{2}$, $\frac{1}{4}$ and 1/16 are provided in the exemplary amplifier. The amplifier 33 includes means 37 for generating an over range signal which is supplied to the microcontroller 15 over the lead 39 when the output of the amplifier exceeds a preset limit. In the exemplary system, the programmable amplifier 33 is a current amplifier. One skilled in the art will appreciate that with suitable modifications, a voltage amplifier could be used instead. A suitable programmable current amplifier with an overrange signal is disclosed in U.S. Pat. No. 4,626,831. The overrange signal is generated if the output current $I_O$ exceeds 100 microamps. The output current is converted to a zero to five volt signal, $V_2$ by a 50K resistor 41. This signal $V_2$ is applied to the AN1 input of the analog multiplexer 13 over lead 43.

The microcontroller 15 selects either $V_1$ or $V_2$ to be converted by the analog to digital converter 17, the reference voltage of the converter, and the gain of the amplifier 33 in order to provide a digital measurement with the greatest resolution for the magnitude of the current $I_p$.

If only $V_2$ from the programmable amplifier 33 is considered, any primary current $I_p$ through the current transformer 3 can be digitized to a 14-bit resolution with eight bits of accuracy. This comes from the 10-bit resolution of the analog to digital converter 17 plus the four bits of resolution provided by the amplifier 33 (gain of $1/16 = \frac{1}{2}^4$). For the relay mentioned previously which must operate over a range of 0-240 A, this means:

$$\frac{2^{14} \text{ bits}}{240 \text{ A}} = 68 \text{ bits/amp}$$

With a 0.5 A pickup, the best the current can be resolved is 1 in 34 or about 3% at 0.5 amps.

In addition, voltage offset of the amplifier 33 begins to affect accuracy at low inputs. Therefore, resistor 11 is chosen to produce +5 V, the maximum input voltage for the multiplexer 13, where the resolution and accuracy of the reading through the amplifier 33 becomes poor. On the relay with which the exemplary apparatus is used, this point was chosen at a primary input current level of 3.75 A. This means that at $I_p = 3.75$ A rms, the voltage across resistor 11 is 5 V and the digitized number resulting from converting $V_1$ at the AN0 input to the microcontroller 15 is 1024 ($2^{10}$). Hence, at or below 3.75 A rms $I_p$, the converted resolution is:

$$\frac{1024 \text{ bits}}{3.75 A} = 273 \text{ bits/amp}$$

which is four times better than the resolution from the input that converts $V_2$. The total resolution for the apparatus is therefore 16 bits.

The microcontroller 15 looks first at the digital signal generated by the analog to digital converter 17 in response to the signal $V_2$ from the amplifier 33. If it is below a fixed number representing 3.75 A $I_p$, then the multiplexer input $V_1$ from resistor 11 is converted. For signals above this level, the microprocessor selects the highest gain of amplifier 33 which does not produce an overrange signal. The microprocessor uses the digital signal generated by the analog to digital converter 17 together with a scale factor as the eight bit accurate, 16-bit resolution output signal representing the current $I_p$. The scale factor is an exponent to the base 2 determined from the selected gain of the amplifier 33 or whether the voltage across the burden resistor 11, and the selected reference voltage on the analog to digital converter.

Figure 2:
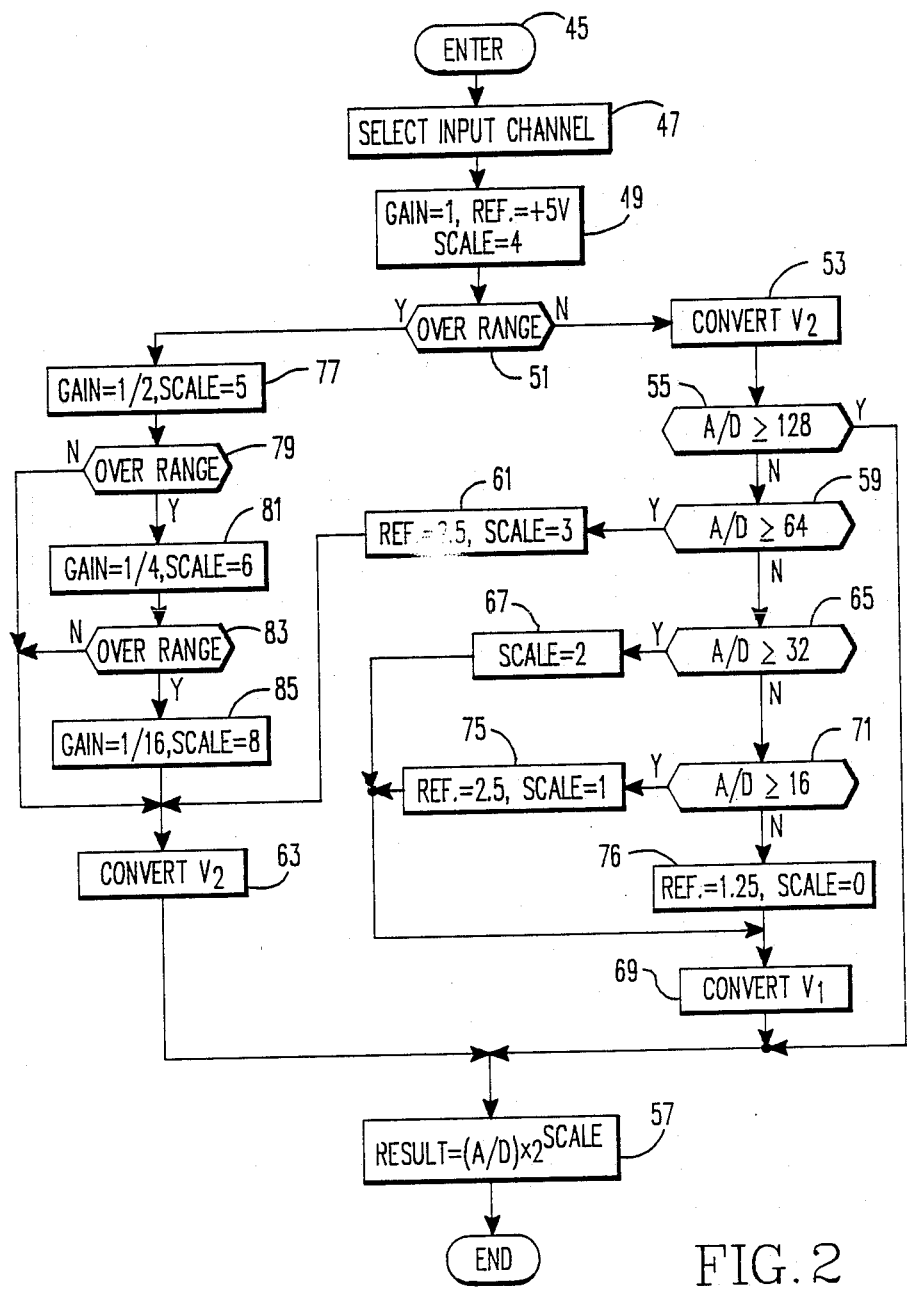
FIG. 2 is a flow chart of a program for a microcontroller which forms a part of the current measuring apparatus illustrated in FIG. 1.

A flow chart of a suitable program for the microcontroller 15 is illustrated in FIG. 2. In this flow chart: hand, if the converted $V_2$ signal is between 16 and 31 as determined at 71, the programmable reference voltage source 19 is set to 2.5 and SCALE is made equal to one at 73, and $V_1$ is converted at 69 for use as the output signal at 57. If the converted $V_2$ signal is less than 16 at 71, a 1.25 reference voltage is selected at 77 and SCALE is made equal to zero, so that the converted $V_1$ signal 69 is read directly as the output signal at 57.

If an overrange signal from the amplifier is detected at 51, the gain is reduced to $\frac{1}{2}$ and the scale factor is increased to five at 77. If this eliminates the overrange signal as determined at 79, $V_2$ is converted at 63 and used as the digital signal at 57 with a SCALE of five. If a gain of $\frac{1}{2}$ still produces an overrange signal at 79, the gain is reduced further to $\frac{1}{4}$ and SCALE is incremented to six at 81. If the overrange signal is eliminated by this reduction in gain as determined at 83, the $V_2$ signal is converted at 63 and used as the digital output signal at 57 with SCALE of six. On the other hand, if an overrange signal is still present at 83, the gain is reduced to 1/16 and SCALE is set to eight at 85, before $V_2$ is converted at 63 and used as the output signal with SCALE equal to eight at 57.

Operation of the apparatus is summarized by the following table:

TABLE

| | PRIMARY CURRENT ($I_p$ Amps rms) | | | | | | | | |
|---|---|---|---|---|---|---|---|---|---|
| | 240 | ≧60 | ≧30 | ≧15 | ≧7.5 | ≧3.75 | ≧1.875 | ≧0.937 | <0.937 |
| Peak $I_s$ | 0.113 A | ≧28.25 mA | ≧14.125 mA | ≧7.062 mA | ≧3.53 mA | ≧1.765 mA | ≧.882 mA | ≧0.441 mA | <0.441 mA |
| Peak $I_{in}$ | 1600 μA | ≧400 μA | ≧200 | ≧100 | ≧50 μA | ≧25 μA | ≧12.25 μA | ≧6.25 μA | <6.25 μA |
| Gain amp 33 | 1/16 | $\frac{1}{4}$ | $\frac{1}{4}$ | 1 | 1 | 1 | 1 | 1 | 1 |
| Peak $I_0$ | 100 μA | ≧25 μA | ≧50 μA | ≧50 μA | ≧50 μA | ≧25 μA | ≧12.5 μA | ≧6.25 μA | <6.25 μA |
| Peak $V_0$ | 5 V | ≧1.25 | ≧2.5 | ≧2.5 | ≧2.5 | ≧1.25 | ≧0.625 | ≧0.3125 | ≧0.3125 |
| Peak V1 | Clipped | Clipped | Clipped | Clipped | Clipped | ≧+5 V | ≧2.5 | ≧1.25 | ≧1.25 |
| A/D ref | +5 V | +5 | +5 | +5 | +5 | +2.5 | +5 | +2.5 | +1.25 |
| Scale | 8 | 8 | 6 | 5 | 4 | 3 | 2 | 1 | 0 |
| Result | 65280 | ≧16384 | ≧8192 | ≧4096 | ≧2048 | ≧1024 | ≧512 | ≧256 | ≧256 |

GAIN refers to the gain of the amplifier 33, REF refers to the reference voltage of the analog to digital converter 17 set by the programmable reference source 19, A/D refers to the eight bit digital signal generated by the analog to digital converter 17 and SCALE is the exponent of the base 2 scale factor.

Upon entering the program at 45, the current signal to be measured is selected at 47. In the three-phase power transmission line for instance, any one of the threephase currents or the zero sequence current can be selected. An amplifier gain of one, and a reference voltage of five volts for the analog to digital converter are then selected which fixes the scale at four, all as indicated at 49. If there is no overrange signal at 51, the signal $V_2$ from the amplifier 33 is selected at 53 for conversion by the analog to digital converter 13. If the converted signal is equal to 128 or more (more than $\frac{1}{2}$ of full scale, zero to 255 on the 8-bit converter) as determined at 55, then the output signal RESULT is made equal at 57 to the digital signal, A/D, multiplied by the scale factor which is two raised to the SCALE power. In the given instance SCALE is equal to four.

If the converted signal is less than 128 at 55, but is more than or equal to 64 at 59, the analog to digital reference voltage is reduced to 2.5 and SCALE is changed to three at 61. The $V_2$ input from the amplifier 33 is then converted at 63 and used as the output at 57.

If the converted $V_2$ signal is less than 64 at 59 but more than or equal to 32 at 65, then SCALE is made equal to two at 67 and the $V_1$ signal is converted at 69 and used as the digital output signal at 57. On the other This table summarizes the operation of the apparatus illustrated in FIG. 1 in accordance with the program outlined in FIG. 2. The second column, headed by I ≧60, indicates the range of values of the specified currents, voltages and the digital number generated by the analog to digital converter for primary current of 60 amps rms and above. In this range, the values of amplifier gain, A/D ref and SCALE remain the same. Column 1 indicates these values at full scale, $I_p$=240 A. The other columns of the Table indicate the values, or range of values, for the indicated parameters for $I_p$s having the ranges of values indicated.

From the above, it can be appreciated that the invention provides and 8-bit accurate, 16-bit dynamic range digital signal for measuring currents which does not require transformer taps or networks of resistors and switches. Thus, the invention offers significant hardware cost savings over the prior art.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. Wide dynamic range current measuring apparatus comprising:
  a current transformer having a primary winding and a secondary winding in which a secondary current proportional to a current flowing in the primary winding is induced;
  an analog to digital converter having a plurality of discrete selectable reference voltages providing a plurality of resolutions for a digital signal generated thereby;
  an amplifier with programmable gain and with means generating an overrange signal when the amplifier output exceeds a preset limit;
  means applying a signal proportional to said secondary current to said amplifier;
  means applying the output of the amplifier to said analog to digital converter to generate said digital signal; and
  control means responsive to said overrange signal selecting the highest programmable gain of the amplifier which does not produce an overrange signal, selecting in response to the magnitude of the digital signal generated by the analog to digital converter the selectable reference voltage for the analog to digital converter which provides the greatest resolution of said digital signal and providing an output signal including said digital signal and a scale factor which is a function of both the selected gain of said amplifier and the selected reference voltage of the analog to digital converter.

2. Wide dynamic range current measuring apparatus comprising:
  a current transformer having a primary winding and a secondary winding in which a secondary current proportional to a current flowing through the primary winding is induced;
  means converting the current flowing in the secondary winding to a voltage signal;
  an analog to digital converter having a selectable reference voltage which provides selectable resolution of a digital signal generated thereby;
  means applying said voltage signal to said analog to digital converter for conversion into a digital signal;
  means responsive to the magnitude of the secondary current for selecting the reference voltage of the analog to digital converter to provide the greatest resolution of the digital signal; and
  means providing an output signal including the digital signal generated by the analog to digital converter and a scale factor generated as a function of the reference voltage selected.

3. The apparatus of claim 2 wherein said analog to digital converter has a plurality of discrete selectable reference voltages, wherein said means selecting the reference voltage includes means selecting the discrete selectable reference voltage for the analog to digital converter which provides the greatest resolution for said digital output signal.

4. Wide dynamic range current measuring apparatus comprising:
  a current transformer having a primary winding and a secondary winding in which secondary current is induced by current flowing through the primary winding;
  an analog to digital converter for converting applied voltage signals to a digital signal;
  a first burden resistor connected in series with said secondary winding and having an ohmic value which produces a first voltage signal for said analog to digital converter having a full range value at a preselected low value of said secondary current;
  current limiting means limiting current through the first burden resistor to said preselected low value of secondary current;
  means generating a reference current proportional to having a magnitude less than said secondary current;
  amplifier means generating a second voltage signal proportional to said reference current; and
    microprocessor means programmed to apply said first voltage signal to said analog to digital converter for conversion to said digital signal when said secondary current is below said preselected low value, to apply said second voltage signal to the analog to digital converter for conversion to said digital signal when said secondary current is above said preselected low value, and to generate an output signal which includes said digital signal and a scale factor dependent upon which of said first and second voltage signals is converted to said digital signal.

5. The apparatus of claim 4 wherein said microprocessor is further programmed to determine whether said secondary current is below said preselected low value by comparing the value of said digital signal generated by the analog to digital converter from said second voltage signal to a preselected value corresponding to said preselected secondary current.

6. The apparatus of claim 5 wherein said analog to digital converter has a plurality of discrete selectable reference voltages providing a plurality of resolutions for said digital signal, and wherein said microprocessor is further programmed to select the discrete selectable reference voltage which provides the greatest resolution for said digital signal and to generate an output signal which includes said scale factor which is also a function of the analog to digital converter selected reference voltage.

7. The apparatus of claim 5 wherein said amplifier means has a plurality of discrete programmable gains and means generating an overrange signal when the output of the amplifier exceeds a preset limit, and wherein said microprocessor is further programmed to select the discrete gain providing the maximum gain for said amplifier without generating an overrange signal, and to generate an output signal with said scale factor which is also a function of said selected amplifier gain.

8. The apparatus of claim 7 including a rectifier bridge connected across said secondary winding and having a positive and a negative dc terminal, and means connecting said first burden resistor between one dc terminal of the rectifier bridge and ground, and wherein said means limiting current through said first burden resistor includes a voltage source and a diode reverse biased by said voltage source connected in parallel with said first burden resistor, wherein said means generating said reference current includes a second burden resistor connected between the other terminal of the rectifier bridge and ground, and a reference resistor in parallel with said second burden resistor and having an ohmic value at least an order of magnitude larger than the ohmic value of said second burden resistor, and wherein said amplifier comprises a current amplifier having an input terminal at virtual ground connected in series with said reference resistor and having an output resistor which converts the output current of the current amplifier to said second voltage signal.

9. The apparatus of claim 8 wherein said analog to digital converter has three discrete selectable reference voltages providing two additional bits of resolution for said digital signal, wherein said amplifier has discrete programmable gains of 1, ½, ¼, and 1/16 to provide four additional bits of resolution to said digital signal, wherein the ohmic value of the first burden resistor is selected to provide a full range voltage signal at said preselected low current while said amplifier only produces about a ¼ full range signal at said preselected low current, and wherein said microprocessor is programmed to generate said scale factor as a function of the reference voltage selected, the programmable gain selected, and the voltage selected for conversion.

* * * * *